United States Patent
Su et al.

(10) Patent No.: US 6,581,083 B1
(45) Date of Patent: Jun. 17, 2003

(54) SYNDROME GENERATOR AND METHOD FOR GENERATING SYNDROMES IN A VIDEO/AUDIO PROCESSING SYSTEM

(75) Inventors: Wei-Ming Su, Taipai (TW); Shin Yung Chen, Taipei (TW); Pei-Jei Hu, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/435,484

(22) Filed: Nov. 8, 1999

(30) Foreign Application Priority Data

Apr. 2, 1999 (TW) .......................... 88105249 A

(51) Int. Cl.[7] ................................ G06F 7/00
(52) U.S. Cl. ........................................ 708/492
(58) Field of Search ................... 708/491–492

(56) References Cited

U.S. PATENT DOCUMENTS 6,003,057 A * 12/1999 Dworkin et al. ............ 708/492
6,341,297 B1 * 1/2002 Tezuka ...................... 708/492

OTHER PUBLICATIONS

"Error Control Coding: Fundamentals and Applications"; Shu Lin et al.; Prentice–Hall Series in Computer Applications in Electrical Engineering 1983; Chapter 6 –*Implementation of Error Correction* pp 167–172.

* cited by examiner

*Primary Examiner*—Tan V. Mai
(74) *Attorney, Agent, or Firm*—Rabin & Berdo, P.C.

(57) ABSTRACT

A means and a method applied in syndrome generation in the Video/Audio processing system is disclosed. The syndromes thereof are effectively and rapidly generated simply using shift register and an exclusive or adder by a recursive operation. For the code words having a number of bytes, the syndromes can be generated by repeating exclusive or (XOR) operation between a shift bit and the above-mentioned bytes, without the extra step of table-matching, saving large memory capacity, greatly reducing the operation cycle and completing the operation rapidly.

16 Claims, 2 Drawing Sheets

SYNDROME GENERATOR AND METHOD FOR GENERATING SYNDROMES IN A VIDEO/AUDIO PROCESSING SYSTEM

BACKGROUND OF THE INVENTION

This application incorporates by reference Taiwanese application Serial No. 80105249, Filed Apr. 2, 1999.

1. Field of the Invention

This invention is related to a means for syndrome generation in a Video/Audio processing system, and more particularly to a generation means and a method for identifying the receiving code words in the compact disk (CD) decoding process.

2. Description of the Related Art

Syndrome generation is a checking process for identifying the receiving code words. The syndrome is generated by multiplying the receiving code words by the checking vectors. The equation of syndrome generation is given as follows:

$$S = \Sigma(R_i \times \alpha^i),$$

wherein S represents the syndromes, $R_i$ represents the code words, $\alpha$ represents the checking vector, which is a shift byte and i is the order. $\alpha$ is the element of a Galois Field, and the value of it is $(00000010)_b$. Taking A, an element of the Galois Field, as an example, the product of A multiplied by $\alpha^i$ can be yielded by left shifting A by i bit, if i is not larger than 7. If i is larger than 7, the product of A multiplied by $\alpha^i$ can be generated by the following equation derived from the character of the Galois Field:

$$\alpha^8 = \alpha^4 \oplus \alpha^3 \oplus \alpha^2 \oplus \alpha^0,$$

wherein "$\oplus$" is an Exclusive OR (XOR) operator.

For any element of the Galois Field, A, as the Most Significant Bit (MSB) is 1, the product of A multiplied by $\alpha$ is the XOR operation result of $(00011101)_b$ and the value of A left-shifting one bit. On the other hand, as the MSB is not 1, the product of A multiplied by is the value of A after left shifting by one bit. This left-shifting and XOR operation are so-called shift operation, and therefore $\alpha$ is called a shift byte. Conventionally, as the mathematics characteristic of a Galois Field is applied in the multiplication performed by any software and hardware, table-matching or logic circuit including a large number of the gate counts is necessary.

It is sometimes possible that a compact disk (CD) may suffer from physical damage, for example, scratches, during production or use. To prevent logical continuous data from being lost as a result of the physical damage, a data scramble technique is typically employed during the data-write process of CD read-only-memory (CD-ROM) production. In short, each logical continuous data stream is first divided into a plurality of blocks according to a predetermined algorithm. Afterwards, another algorithm is employed to scramble blocks of one logical continuous data stream with blocks of other logical continuous data streams. The resulting scrambled data are then sequentially and continuously written into the physical spaces of the CD. When, unfortunately, a certain portion of the CD is damaged, the portion of damaged data belonging to one logical continuous data stream may be recovered by the associated un-damaged data of the respective logical continuous data stream via the algorithm. Therefore, in addition to the raw data, some extra data, including control code, sync code, and protection code are added to the raw data to form the complete data in the CD.

In order to prevent data damage or loss, when original data are to be stored in disks, the following encoding operations are sequentially performed: C3 encoding, C2 encoding, interleaving, and C1 encoding.

The interleaving operation re-partitions frames of C2 coded data into different frames for C1 coding. After interleaving, if data is damaged, the damaged data is dispersed among different frames of the decoded data, and thus correction probability is enhanced.

Therefore, when data in a disk is read, the following decoding operations are sequentially performed: C1 decoding, deinterleaving, C2 decoding, and C3 decoding. Deinterleaving is a reverse operation of interleaving.

During the process of writing data into the CD, encoding the C3 code, encoding the C2 code, interleaving codes and encoding the C1 code are the essential steps, wherein the C3 code is encoded by sectors, each sector has 98 frames and each frame has 24 bytes. The C2 code is encoded by frame. In the step of encoding the C2 code, each frame has an additional four parity check bytes beyond the 24 bytes output from the C3 code. The original 24 bytes and the additional 4 parity check bytes are yielded by the following equation:

$$W_3 \times G_2 = V_2,$$

wherein $W_3$ is the 24-byte code word matrix of C2 output from C3, which is a 1×24 matrix, $G_2$ is a generating matrix, which is a 24×28 matrix, and $V_2$ is the code word of the C2 code, which is a 1×28 matrix, and also the code word after the C2 code encoding step.

Similarly, the 28-byte code word of the C2 code is first processed through interleaving codes, then multiplied by a generating matrix $G_1$ of the C1 code to yield a 32-byte code word $V_1$. $V_1$ is the code word after the C1 code encoding. The 32-byte code word $V_1$ includes the above 28 bytes from the C2 code word and the other four bytes of the parity check code. Then, the data after encoding is written in the CD.

While the data is read from the CD, the read source code has to be decoded. The process of decoding includes sequentially the steps of decoding the C1 code, deinterleaving codes, decoding the C2 code, and decoding the C3 code. The steps of decoding the C1 code include multiplying the read 32-byte code word, which is a 1×32 matrix $V_1$, by a 32×4 checking matrix $H_1$ to yield a 1×4 syndromes matrix S. The equation is given as follows.

$$S = V_1 \times H_1 = [S_0 S_1 S_2 S_3],$$

wherein $$S_0 = V_0 \oplus V_1 \oplus V_2 \oplus_{31};$$

$$S_1 = V_0 \oplus V_1 \alpha \oplus V_2 \alpha^2 \oplus \ldots V_{31} \alpha^{31};$$

$$S_2 = V_0 \oplus V_1 \alpha^2 \oplus V_2 \alpha^4 \oplus \ldots V_{31} \alpha^{62}; \text{ and}$$

$$S_3 = V_0 \oplus V_1 \alpha^3 \oplus V_2 \alpha^6 \oplus \ldots V_{31} \alpha^{93}.$$

The yielded data are identified to be correct if the values of $S_0$, $S_1$, $S_2$ and $S_3$ are all equal to zero. If not, there must exist errors.

The processes of decoding the C2 code and the C3 code include also similar syndrome generation steps. It is therefore not further described herein.

The equation for generating the four syndromes can be represented as followed:

$$S_j = \Sigma R_i \times (\alpha^i)^j,$$

wherein, $R_i$ represents the receiving code words $R_0$, $R_1$, $R_2$, $R_3$, ..., and $R_{31}$, i=0~31, and $S_j$ represents the syndromes $S_0$, $S_1$, $S_2$, and $S_3$, j=0~3

Let $(S_j)_i = R_0 \times (\alpha^0)^j \oplus R_1 \times (\alpha^1)^j \oplus R_2 \times (\alpha^2)^j \oplus \ldots \oplus R_i \times (\alpha^i)^j$, wherein the syndrome $(S_j)_i$ is the result for generating recursively for i+1 times.

FIG. 1 is a block diagram of the conventional syndrome generating means. Referring to FIG. 1, the code word $R_0$ is first written in the register 10, which is the syndrome $(S_j)_0$. At the next timing, the code word $R_1$ is multiplied by the checking vector $(\alpha^1)^j$ using a multiplier 12. The product yielded by the above-mentioned multiplication operation and the output value of the register 10 are then processed through an XOR operation by an XOR gate 14 to yield the syndrome $(S_j)_1$, and then the syndrome $(S_j)_1$ is fed back to the register 10. At the next timing, similar operation is performed to yield the syndrome $(S_j)_2$. By such recursive operation, the finally yielded syndrome $(S_j)_{31}$ is syndrome Sj.

For every multiplication operation, using the conventional syndrome generating means, table matching or complicate logic circuits have to be utilized. For a syndrome generation, a multiplication operation and an XOR operation are both necessary so that not only a large number of table matching steps have to be taken but also a great number of logic gates are used, which needs large memory capacity and extends the processing period.

SUMMARY OF THE INVENTION

It is therefore an object of the invention to provide a means and method for syndrome generation which makes use of a shift register and an XOR gate for decoding and generating the syndrome recursively. The means and method is used in the Video/Audio processing system, which rapidly and effectively accomplishes the syndrome generation. This invention has the advantages of simple structure, reducing significant operation time, and reducing the memory capacity.

It is therefore another object of the invention to provide a means for syndrome generation, which is able to accomplish the syndrome generation for a code word with a number of bytes. The means for syndrome generation includes an XOR gate and a register for receiving a shift byte of the bytes. Then, XOR operation is then performed to yield the syndrome.

It is therefore another object of the invention to propose a method for syndrome generation, which is used for generating the syndrome for a code word with a number of bytes. First, let one of the bytes be a register value. Next, an XOR operation of the register value, a shift byte and another one of the bytes is performed. The result of the XOR operation replaces the register value and the step is repeated until the syndrome generation is accomplished.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The decoding process in a video/audio processor, for example, a CD ROM, the receiving code word can be, for example, a 32-byte C1 code. Such a code can be represented as $(R_0, R_1, R_2, R_3, \ldots, R_{31})$, wherein $R_0, R_1, R_2, R_3, \ldots$ and, $R_{31}$ are all bytes. The equation for generating the four syndromes $S_0, S_1, S_2, S_3$ is as follows.

$$S_j = \Sigma_{i=0\sim31} R_i \times (\alpha^i)^j,$$

wherein j=0~3.

In this embodiment, an 8-byte syndromes $S_1$, as j=1, in the C1 code decoding process is taken as an example for further illustration.

First, the equation of generating the syndrome $S_1$ is rearranged as follows.

$$S_1 = \Sigma R_i \times (\alpha^i) = (((\ldots ((((R_{31} \times \alpha \oplus R_{30}) \times \alpha \oplus R_{29}) \times \alpha \oplus R_{28}) \ldots \times \alpha \oplus R_2) \times \alpha \oplus R_1) \times \alpha \oplus R_0) \quad (1)$$

Wherein, shift byte a is the element of a Galois Field, the value of which is $(00000010)_b$, "×" represents a multiplication operation, "⊕" represents an XOR operation. The equations of generating syndromes $S_2$ and $S_3$ are similar to that of the syndrome $S_1$.

Figure 1:
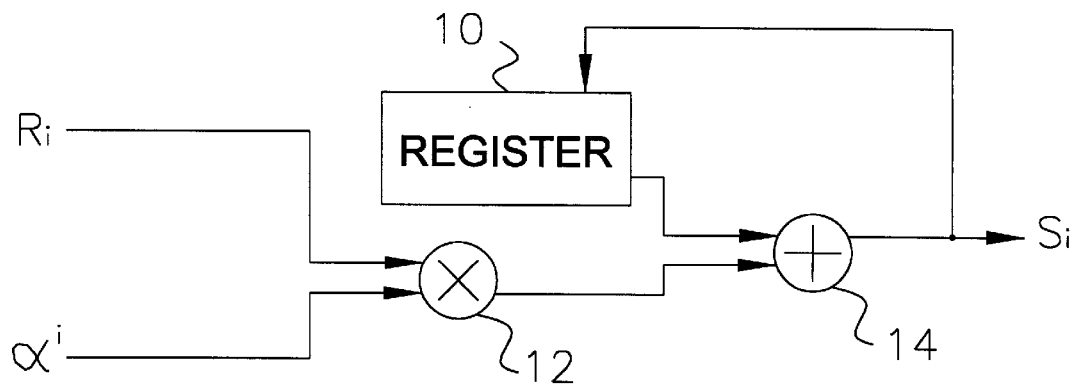
FIG. 1 (Prior Art) is the block diagram of a conventional syndrome generation means.
Figure 2:
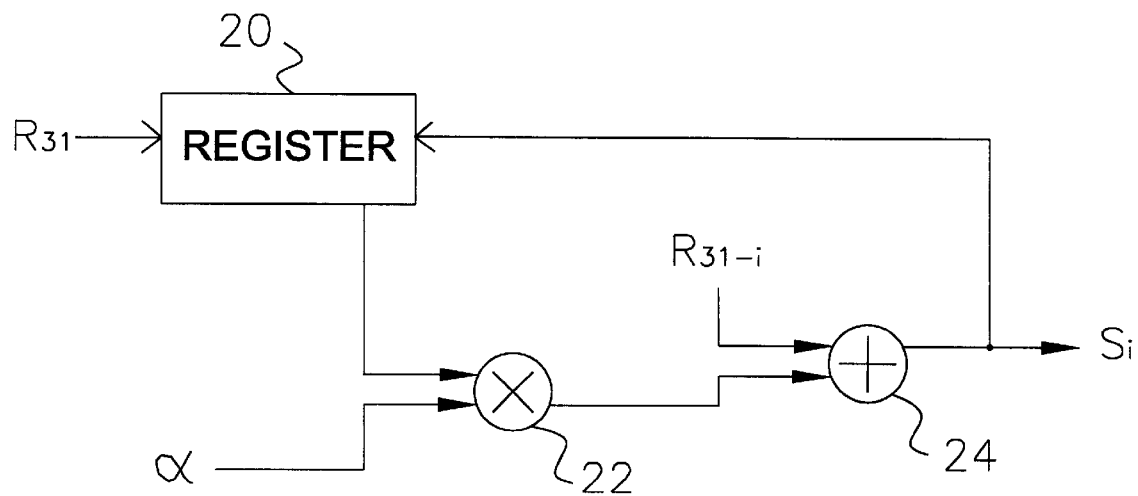
FIG. 2 is a block diagram of a syndrome generation means according a preferred embodiment of the invention.

Referring to FIG. 2, it is the block diagram of a syndrome generation means according a preferred embodiment of the invention.

Taking the generation of the syndrome $S_1$ as an example, the value of the first byte $R_{31}$ is first written in the register 20, the value of the first byte $R_{31}$ written in the register 20 is then multiplied by a shift byte a by a multiplier 22 to yield an output value. The result of the XOR operation, using an XOR gate 24, of the above-mentioned output value and the second byte $R_{30}$ is then output and again written in the register 20. Further, the result of the XOR operation written in the register 20 is multiplied by the shift byte a and after the XOR operation with the third byte $R_{29}$, the result is again written in the register 20. The foregoing recursive operation has to be done for each byte of the code word. The final output result of the XOR gate 24 is the value of the syndrome $S_1$.

The shift byte a includes 8 bits. The first bit is defined as the least significant bit (LSB) and the eighth bit is defined as the most significant bit (MSB). For the multiplication operation of an 8-byte Galois Field's element and the shift byte $\alpha$, while as the above-mentioned generating means is applied for syndrome generation, the product is equal to the value of left-shifting the first to the seventh bits for 1 bit if the MSB is not 1. However, the product of the same multiplication operation is equal to the result of XOR operation of the value of left-shifting the first to the seventh bits one bit of the 8-byte Galois Field's element and $(00011101)_b$, if the MSB, is an effective one, which is 1. Consequently, a multiplier can be replaced by a simple XOR gate, which accomplishes an equal multiplication operation, in the syndrome generation means in FIG. 2. Only simple XOR gates with the input of the shift byte $\alpha$, $R_i$ and the output of the register are required for the multiplication operation.

Figure 3:
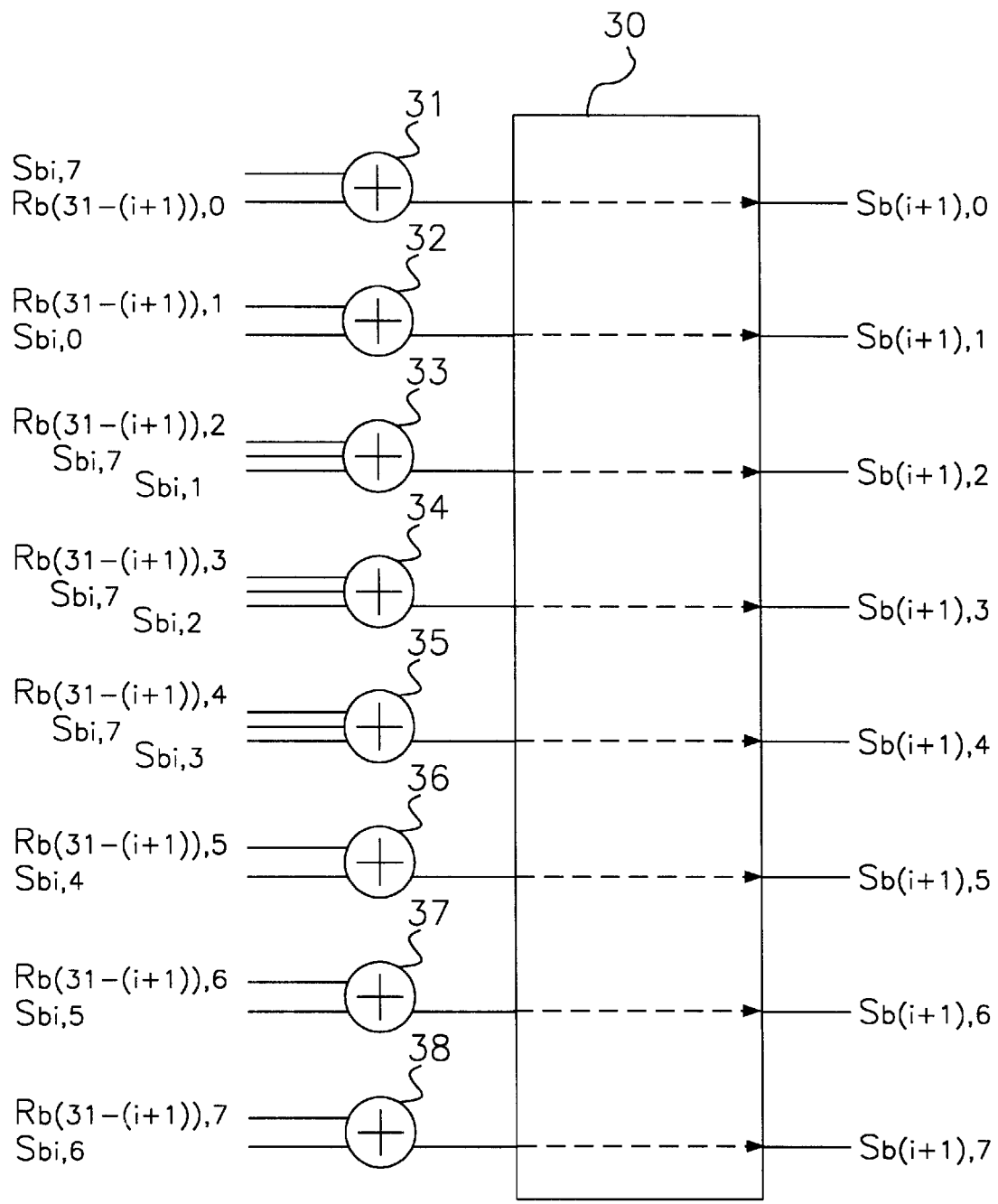
FIG. 3 is the structure of a syndrome generation means according a preferred embodiment of the invention.

Referring to FIG. 3, it shows the structure of a syndrome generation means according a preferred embodiment of the invention. According to the preferred embodiment, by the principle of the shift register, the 8-byte syndrome can be generated only using a register 30 and XOR gates 31, 32, 33, 34, 35, 36, 37, 38.

In the equation (1), the operation of "×α" can be accomplished directly by left-shifting the first to the seventh bits for one bit. However, as the MSB is 1, the operation of "×α" is equal to the XOR operation of the value of left-shifting the first to the seventh bits for one bit and $(00011101)_b$. Therefore, simply XOR gates are needed for the multiplication operation.

The syndrome $S_1$ is a value having 8 bits. Let $S_{1,i}$ be equal to the value of $((\ldots((((R_{31} \times \alpha \oplus R_{30}) \times \alpha \oplus R_{29}) \times \alpha \oplus R_{28}) \ldots R_{31-(i-1)}) \times \alpha \oplus R_{31-i})$, wherein $i = 0 \ldots 31$. $S_{1,i}$ represents the value after i times of multiplication and XOR operation are repeated. For example, as $i=1$, $S_{1,1} = R_{31} \times \alpha \oplus R_{30}$, then $S_{1,i+1} = S_{1,i} \times \alpha \oplus R_{31-(i+1)}$, wherein $S_{bi,0}$, $S_{bi,1}$, $S_{bi,2}$, $S_{bi,3}$, $S_{bi,4}$, $S_{bi,5}$, $S_{bi,6}$, and $S_{bi,7}$ respectively represent the values of the eight bits of $S_{1,i}$ from the LSB to the MSB and $R_{bi,0}$, $R_{bi,1}$, $R_{bi,2}$, $R_{bi,3}$, $R_{bi,4}$, $R_{bi,5}$, $R_{bi,6}$, and $R_{bi,7}$ respectively the 8 bits of one byte $R_i$ of the receiving code word, and the subscript b represents that each bit is the binary value of $R_i$, or $S_{1,i}$ is a binary bit.

Let $$S_{1,0} = R_{31};$$

$$S_{1,1} = R_{31} \times \alpha \oplus R_{30} = S_{1,0} \times \alpha \oplus R_{30};$$

$$S_{1,2} = (R_{31} \times \alpha \oplus R_{30}) \times \alpha \oplus R_{29} = S_{1,1} \times \alpha \oplus R_{29};$$

$\ldots$ $$S_{1,31} = (((\ldots((((R_{31} \times \alpha \oplus R_{30}) \times \alpha \oplus R_{29}) \times \alpha \oplus R_{28}) \ldots \times \alpha \oplus R_2) \times \alpha \oplus R_1) \times \alpha \oplus R_0) = S_1 \quad (2)$$

The first step is the multiplication operation of $R_{31} \times \alpha$. Since $\alpha = (00000010)_b$, the product of the multiplication operation of $R_{31} \times \alpha$ is the result of the XOR operation of $R_{30}$ and the value of left-shifting each bit of $S_{1,0}$ for one bit. The result is then output and written in the register 30. Therefore, the output value of the register 30 is $S_{1,1}$. The 8 bits of $S_{1,1}$ are shown as follows:

$$S_{b1,0} = R_{b30,0};$$

$$S_{b1,1} = S_{b0,0} \oplus R_{b30,1};$$

$$S_{b1,2} = S_{b0,1} \oplus R_{b30,2};$$

$$S_{b1,3} = S_{b0,2} \oplus R_{b30,3};$$

$$S_{b1,4} = S_{b0,3} \oplus R_{b30,4};$$

$$S_{b1,5} = S_{b0,4} \oplus R_{b30,5};$$

$$S_{b1,6} = S_{b0,5} \oplus R_{b30,6}; \text{ and}$$

$$S_{b1,7} = S_{b0,6} \oplus R_{b30,7} \quad (3)$$

That is to say the operation of $S_{1,1} = S_{1,0} \times \alpha \oplus R_{30}$ is by now accomplished.

According to a similar rule, the value of $S_{1,i+1}$ can be yielded by a recursive operation. The value of $S_{1,i+1}$, at the next timing, is the XOR operation value of $R_{(31-(i+1))}$ and left-shifting the value of $S_{1,i}$. The generating equation is $S_{1,i+1} = S_{1,i} \times \alpha \oplus R_{(31-(i+1))} = (\ldots(((R_{31} \times \alpha \oplus R_{30}) \times \alpha \oplus R_{29}) \times \alpha \oplus R_{28}) \ldots \times \alpha \oplus R_{(31-(i+1))})$, wherein $$S_{b(i+1),0} = R_{b(30-i),0};$$

$$S_{b(i+1),1} = S_{bi,0} \oplus R_{b(30-i),1};$$

$$S_{b(i+1),2} = S_{bi,1} \oplus R_{b(30-i),2};$$

$$S_{b(i+1),3} = S_{bi,2} \oplus R_{b(30-i),3};$$

$$S_{b(i+1),4} = S_{bi,3} \oplus R_{b(30-i),4};$$

$$S_{b(i+1),5} = S_{bi,4} \oplus R_{b(30-i),5};$$

$$S_{b(i+1),6} = S_{bi,5} \oplus R_{b(30-i),6};$$

$$S_{b(i+1),7} = S_{bi,6} \oplus R_{b(30-i),7} \quad (4)$$

Therefore, the value of $S_{1,i+1}$ can be generated.

However, the left-shifting rule can not be applied to a multiplicand, an element of the Galois Field, having an effective MSB, 1. It is because the ninth bit becomes 1, while each bit of the multiplicand having an effective MSB is left shifted by one bit, but only 8 bits are included in a byte. As a result, the character of the Galois Field has to be applied in the multiplication operation. All elements of the Galois Field satisfy the following polynomial:

$$P(x) = x^8 \oplus x^4 \oplus x^3 \oplus x^2 \oplus 1;$$

therefore, $\alpha^8 = \alpha^4 \oplus \alpha^3 \oplus \alpha 2 \oplus 1$.

For each 8-bit element of the Galois Field, the foregoing polynomial is always true. For example, while $\alpha^7$ having an MSB of 1 is left-shifted by one bit, an additional bit may occur. Therefore, $\alpha^8$ can be represented as $(00011101)_b$. Consequently, the simple operation of being multiplied by a has to be replaced by the XOR operation of $(0001101)_b$ and the value of the multiplicand after each bit of it is left-shifted by one bit if the multiplicand has an MSB of 1.

In other words, if $S_{bi,7}$ of $S_{1,i}$ is 1, the generation of $S_{1,i+1}$ can be accomplished by left-shifting each bit of the $S_{1,i}$ by one bit, performing the XOR operation of the left-shifting value and $(00011101)_b$ and then performing another XOR operation with $R_{(31-(i+1))}$. Referred to FIG. 3, the operation can be directly designed in the hardware, simply by adding the third input terminals to the XOR gates, which originally have two input terminals. In other words, $$S_{b(i+1),0} = 1 \oplus R_{b(30-i),0};$$

$$S_{b(i+1),1} = 0 \oplus S_{bi,0} \oplus R_{b(30-i),1};$$

$$S_{b(i+1),2} = 1 \oplus S_{bi,1} \oplus R_{b(30-i),2};$$

$$S_{b(i+1),3} = 1 \oplus S_{bi,2} \oplus R_{b(30-i),3};$$

$$S_{b(i+1),4} = 1 \oplus S_{bi,3} \oplus R_{b(30-i),4};$$

$$S_{b(i+1),5} = 0 \oplus S_{bi,4} \oplus R_{b(30-i),5};$$

$$S_{b(i+1),6} = 0 \oplus S_{bi,5} \oplus R_{b(30-i),6}; \text{ and}$$

$$S_{b(i+1),7} = 0 \oplus S_{bi,6} \oplus R_{b(30-i),7} \quad (5)$$

However, the circuit design can be further simplified because the XOR operation with $(00011101)_b$ has to be taken only when $S_{bi,7}$ is 1. Therefore, the XOR operation with $(00011101)_b$ can be replaced by an XOR operation with $(0\ 0\ 0\ S_{bi,7}\ S_{bi,7}\ S_{b,7}\ 0\ S_{bi,7})_b$. Also, to generate $S_{1,i+1}$, the XOR operation of the 4 bits and 0 can be omitted since it does not effect the output result. In other words, the generation of $S_{1,i+1}$ in equation (5) can be modified as followed:

$$S_{b(i+1),0} = S_{bi,7} \oplus R_{b(30-i),0};$$

$$S_{b(i+1),1} = S_{bi,0} \oplus R_{b(30-i),1};$$

$$S_{b(i+1),2} = S_{bi,7} \oplus S_{bi,1} \oplus R_{b(30-i),2};$$

$$S_{b(i+1),3} = S_{bi,7} \oplus S_{bi,2} \oplus R_{b(30-i),3};$$

$$S_{b(i+1),4} = S_{bi,7} \oplus S_{bi,3} \oplus R_{b(30-i),4};$$

$$S_{b(i+1),5} = S_{bi,4} \oplus R_{b(30-i),5};$$

$$S_{b(i+1),6} = S_{bi,5} \oplus R_{b(30-i),6}; \text{ and}$$

$$S_{b(i+1),7} = S_{bi,6} \oplus R_{b(30-i),7} \quad (6)$$

The XOR operations shown in equation (6) can be accomplished simply by using the XOR gates 31, 32, 33, 34, 35, 36, 37, 38 and adding new input terminals $S_{bi,7}$ to the XOR gates 31, 33, 34, 35, respectively.

That is to say, while the MSB $S_{bi,7}$ of $S_{1,i}$ is 1, $S_{1,i} \times \alpha$ is equal to the result of the XOR operation of left-shifting $S_{1,i}$ and $(00011101)_b$. Simultaneously, the forgoing result is then taking an XOR operation with $R_{(31-(i+1))}$. The result of the XOR operation with $R_{(31-(i+1))}$ is then output to the register to yield $S_{1,i+1}$. If the MSB $S_{bi,7}$ of $S_{1,i}$ is not 1 but 0, $S_{bi,7}$ does not effect the output of the XOR operation. Thus, $S_{1,i} \times \alpha$ is equal to the result of the XOR operation of $R_{(31-(i+1))}$ and the value of $S_{1,1}$, the result of which is then output to the register to yield the value of $S_{1,i+1}$.

As a result, two different generation methods of different MSBs $S_{bi,7}$ can be performed in a single circuit, using this means. Moreover, the syndrome $S_i$ is generated by recursive operation from $S_{1,1}$ to $S_{1,31}$.

For generating the syndrome $S_0$, the equation is:

$$S_0 = \Sigma R_i \times (\alpha^i)^0 R_{31} \oplus R_{30} \oplus R_{29} \oplus \ldots \oplus R_1 \oplus R_0.$$

The generating of $S_0$ does not involve the problem of shifting bit but only a simple XOR operation. Therefore, each XOR register does not need the input of $S_{bi,7}$.

For the generation of the syndrome $S_2$, the equation is as follows.

$$S_2 = \Sigma R_i \times (\alpha^i)^2 = ((\ldots ((R_{31} \times \alpha^2 \oplus R_{30}) \times \alpha^2 \oplus R_{29}) \times \alpha^2 \oplus \ldots \times \alpha^2 \oplus R_1) \times \alpha^2 \oplus R_0)$$

Left-shifting the multiplicand by two bits may result in the occurrence of the effective bit, 1, in the highest two bits. Similarly, some necessary XOR gates are input with $S_{bi,6}$ and $S_{bi,7}$.

Further, the generation equation of $S_3$ is as follows:

$$S_3 = \Sigma R_i \times (\alpha^i)^3 = ((\ldots ((R_{31} \times \alpha^3 \oplus R_{30}) \times \alpha^3 \oplus R_{29}) \times \alpha^3 \oplus \ldots \times \alpha^3 \oplus R_1) \times \alpha^3 \oplus R_0).$$

According to the invention, using the principle of the shift register not only saves a great number of control gates but also reduces the period of generating syndromes. For example, conventionally, table-matching or a direct multiplication operation is used for the multiplication operation with the multiplicand of $\alpha$ to $\alpha^{93}$. However, it is time-consuming. On the other hand, using the shift register and the XOR gate of the invention does not require such a large number of operation cycles, but only the XOR operation to complete the generation of the syndromes. The means and method for syndromes generation of the invention include simple structure and further save a significant operation period and memory capacity.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A code word syndrome generator, wherein the code word has a plurality of bytes $R_0, R_1, \ldots R_k$, k is an integer, the generator comprising:

a register having
   means for outputting first data (i), where i is an integer, the register outputting the first data (i) successively for $i = 1, 2, \ldots, k$;
   means for receiving the byte $R_k$ for storage therein when $i = 1$, so that the stored first data $(i) = R_k$ when $i = 1$, and for subsequently receiving an output data (i) that replaces the stored first data (i);

a multiplier for receiving a shift byte of a Galois Field and the stored first data (i) from the register, and for outputting second data (i) as the product of the first data (i) and the Galois Field shift byte; and an exclusive or (XOR) gate for receiving the second data (i) and the byte $R_{k-i}$, and outputting the output data (i) as the product of the byte $R_{k-i}$ and the second data (i), so that the output data (i) for $i = k$ is the syndrome of the code word.

2. The code word syndrome generator as claimed in claim 1, wherein the code word comprises 32 bytes, and k is equal to 31.

3. The code word syndrome generator as claimed in claim 1, wherein the code word syndrome generator generates the syndrome of the C1 code decoding in a compact disk (CD) decoding process.

4. The code word syndrome generator as claimed in claim 1, wherein the code word comprises 28 bytes, and k is equal to 27.

5. The code word syndrome generator as claimed in claim 1, wherein the code word syndrome generator is used for generating the syndrome of the C2 code decoding in a CD decoding process.

6. A generator of a syndrome S of a code word, wherein for the code word having a plurality of bytes $R_0, R_1, \ldots R_k$, k is an integer, $R_k$ being presentable as $(R_{b(k),0}, R_{b(k),1}, R_{b(k),2}, R_{b(k),3}, R_{b(k),4}, R_{b(k),5}, R_{b(k),6}, R_{b(k),7})$, i being an integer, $i = 0, 1, \ldots, k$, and for values $S_i = (S_{b(i),0}, S_{b(i),1}, S_{b(i),2}, S_{b(i),3}, S_{b(i),4}, S_{b(i),5}, S_{b(i),6}, S_{b(i),7})$, the generator comprises a plurality of XOR gates, the XOR gates including means, responsive to receipt of $S_0 = R_k$, and receipt of $R_{k-i}$ successively with $i = 1, 2, \ldots k-1$, for generating values $S_{i+1}$, wherein:

$$S_{b(i+1),0} = S_{bi,7} \oplus R_{b(k-i-1),0};$$

$$S_{b(i+1),1} = S_{bi,0} \oplus R_{b(k-i-1),1};$$

$$S_{b(i+1),2} = S_{bi,7} \oplus S_{bi,1} \oplus R_{b(k-i-1),2};$$

$$S_{b(i+1),3} = S_{bi,7} \oplus S_{bi,2} \oplus R_{b(k-i-1),3};$$

$$S_{b(i+1),4} = S_{bi,7} \oplus S_{bi,3} \oplus R_{b(k-i-1),4};$$

$$S_{b(i+1),5} = S_{bi,4} \oplus R_{b(k-i-1),5};$$

$$S_{b(i+1),6} = S_{bi,5} \oplus R_{b(k-i-1),6};$$

$$S_{b(i+1),7} = S_{bi,6} \oplus R_{b(k-i-1),7};$$

whereby the syndrome S is determined as the value $S_k$.

7. The generator of syndrome S, as claimed in claim 6, wherein the generator generates the syndrome in a CD decoding process.

8. A method for generating a syndrome of a code word, wherein the code word has a plurality of bytes $R_0, R_1, \ldots R_k$, k is an integer, the method comprising:

(a) setting $i = 1$, wherein i is an integer, $i = 1, 2 \ldots, k$;

(b) inputting the byte $R_k$ into a register;

(c) generating a first data (i) corresponding to the data stored in the register;

(d) generating a second data (i) as the product of the first data (i) and a shift byte of a Galois Field;

(e) generating a third data (i) as the product of the byte $R_{k-i}$ and the second data (i);

(f) inputting the third data (i) to the register, and (g) increasing i by 1, and repeating said steps (c) to (g) until i=k, wherein the syndrome is the third data (i) when i=k.

9. The method for generating a syndrome of a code word as claimed in claim 8, including applying said steps (a) to (g) for generating the syndrome of the C1 code decoding in a compact disk (CD) decoding process.

10. The method for generating a syndrome as claimed in claim 8, wherein the code word comprises 32 bytes, and k equals to 31.

11. The method for generating a syndrome of a code word as claimed in claim 8, wherein the code word comprises 28 bytes, and k equals to 27.

12. The method for generating a syndrome as claimed in claim 8, including applying said steps (a) to (g) for generating the syndrome of the C2 code decoding in a CD decoding process.

13. A generator of code word syndromes of order j ($S_j$), j=1, 2 and 3, wherein the code word has a plurality of bytes $R_0, R_1, \ldots R_k$, k is an integer, a shift byte of a Galois Field being designatable as $\alpha$ the generator comprising:
   a register having
      means for outputting first data (i), where i is an integer, the register outputting the first data (i) successively for i=1, 2 . . . , k,
      means for receiving the byte $R_k$ for storage therein when i=1, so that the stored first data (i)=$R_k$ when i=1, and for subsequently receiving an output data (i) that replaces the stored first data (i);
   a multiplier for receiving the stored first data (i) from the register, and for further receiving any of $\alpha^j$ where j is a power selected from among j=1, j=2 and j=3, and for outputting second data (i) as the product of the first data (i) and $\alpha^j$; and
   an exclusive or (XOR) gate for receiving the second data (i) and the byte $R_{k-i}$, and outputting the output data (i) as the product of the byte $R_{k-i}$ and the second data (i), so that the output data (i) for i=k is the syndrome $S_j$.

14. A generator of a code word syndrome of order j ($S_j$), j an integer, wherein the code word has a plurality of bytes $R_0, R_1, \ldots R_k$, k is an integer, a shift byte of a Galois Field being designatable as $\alpha$ the generator comprising:
   a register having
      means for outputting first data (i), where i is an integer, the register outputting the first data (i) successively for i=1, 2 . . . , k,
      means for receiving the byte $R_k$ for storage therein when i=1, so that the stored first data (i)=$R_k$ when i=1, and for subsequently receiving an output data (i) that replaces the stored first data (i);
   a multiplier for receiving the stored first data (i) from the register, and for further receiving $\alpha^j$, and for outputting second data (i) as the product of the first data (i) an $\alpha^j$; and
   an exclusive or (XOR) gate for receiving the second data (i) and the byte $R_{k-i}$, and outputting the output data (i) as the product of the byte $R_{k-i}$ and the second data (i), so that the output data (i) for i=k is the syndrome $S_j$.

15. The generator of claim 14, wherein the order of the syndrome is 2 (j=2).

16. The generator of claim 14, wherein the order of the syndrome is 3 (j=3).

* * * * *